United States Patent
Yamada et al.

(10) Patent No.: US 6,459,327 B1
(45) Date of Patent: Oct. 1, 2002

(54) FEEDBACK CONTROLLED SUBSTRATE BIAS GENERATOR

(75) Inventors: Hitoshi Yamada; Tamihiro Ishimura; Yoshio Ohtsuki, all of Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 07/986,571

(22) Filed: Dec. 7, 1992

(30) Foreign Application Priority Data

Dec. 9, 1991 (JP) ............................................ 3-324809

(51) Int. Cl.[7] .................................................. H03K 3/01
(52) U.S. Cl. ...................... 327/534; 327/535; 327/276; 331/57
(58) Field of Search .......................... 307/296.2, 296.4; 331/57; 327/534, 535, 538, 543, 544, 276, 277

(56) References Cited

U.S. PATENT DOCUMENTS

| | | | | |
|---|---|---|---|---|
| 4,142,114 A | * | 2/1979 | Green | 307/296.2 |
| 4,705,966 A | * | 11/1987 | Van Zanten | 307/296.2 |
| 4,794,278 A | * | 12/1988 | Vajoic | 307/296.2 |
| 4,820,936 A | * | 4/1989 | Veendrick et al. | 307/296.2 |
| 4,843,256 A | * | 6/1989 | Scade et al. | 307/296.2 |
| 4,843,258 A | * | 6/1989 | Miyawaki et al. | 307/296.2 |
| 4,899,071 A | * | 2/1990 | Morales | 307/602 |
| 5,003,197 A | * | 3/1991 | Nojima et al. | 307/296.2 |
| 5,025,178 A | * | 6/1991 | Nunally | 307/296.5 |
| 5,041,739 A | * | 8/1991 | Goto | 307/296.2 |
| 5,113,088 A | * | 5/1992 | Yamamoto et al. | 307/296.2 |
| 5,157,278 A | * | 10/1992 | Min et al. | 307/296.2 |
| 5,182,529 A | * | 1/1993 | Chern | 307/296.2 |
| 5,247,208 A | * | 9/1993 | Nakayama | 327/534 |

FOREIGN PATENT DOCUMENTS

| | | | | |
|---|---|---|---|---|
| EP | 174694 | * | 3/1986 | 307/296.2 |
| JP | 63169118 | * | 7/1988 | 327/384 |
| JP | 0004113 | * | 1/1989 | 307/548 |
| JP | 23659 | * | 1/1991 | 307/296.2 |

* cited by examiner

Primary Examiner—Tuan T. Lam
(74) Attorney, Agent, or Firm—Venable; Robert J. Frank (57) ABSTRACT

A feedback controlled substrate bias generator having a substrate bias level sensing circuit, a charge pump circuit and an improved oscillator is disclosed. The substrate bias level sensing circuit is coupled to a semiconductor substrate for sensing a bias voltage of the semiconductor substrate and outputting a control signal in response to the sensed bias voltage. The charge pump circuit is coupled to the semiconductor substrate and the substrate bias level sensing circuit for receiving a clock pulse and the control signal and supplying the bias voltage to the semiconductor substrate in response to the received signals. The improved oscillator is coupled to the charge pump circuit for generating the clock pulse. The improved oscillator has a loop circuit having a plurality of serially and circularly coupled inverters each of which has a source terminal applied to voltage from a voltage source, an input terminal for receiving an input signal and an output terminal for outputting an output signal. The improved oscillator further has a plurality of switches each of which has a control terminal, a first terminal coupled to the source terminal of a corresponding inverter of the loop circuit and a second terminal coupled to the voltage source. Each of the switches electrically cuts the first and second terminals when the input signal of the one of the inverters except for the corresponding inverter changes from one level to another.

17 Claims, 5 Drawing Sheets

FEEDBACK CONTROLLED SUBSTRATE BIAS GENERATOR

CROSS REFERENCE TO RELATED APPLICATION

This application claims the priority of Japanese Application Serial, No. 324809/1991, filed Dec. 9, 1991, the subject matter of which is incorporated herein by reference. This application also claims an invention a part of which is disclosed in the copending application Serial No. 07/519,572, filed May 7, 1990, (now Pat. No. 5,113,088 issued May 12, 1992) which is a continuation-in-part of application Serial No. 07/433,213, filed Nov. 7, 1989 now abandoned. The above copending application which is commonly assigned by this applicant claims the priority of Japanese Application Serial No. 283,448/1998, filed Nov. 9, 1988.

BACKGROUND OF THE INVENTION

The present invention relates to a feedback controlled substrate bias generator suitable for use in a semiconductor memory circuit, and more specifically to a feedback controlled substrate bias generator comprising a feedback controller having a circuit for sensing a bias level of a semiconductor substrate, a charge pump circuit and an improved oscillator.

A feedback controlled substrate bias generator has been disclosed in U.S. Pat. Nos. 4,142,114, 4,439,692, 4,471,290 and 4,794,278, for example. The disclosed substrate bias generator comprises an oscillator for generating a clock signal, a charge pump circuit electrically connected to the oscillator, for generating a bias voltage level to be applied to a semi-conductor substrate, and a sensing circuit for detecting the bias voltage level applied to the semiconductor substrate and for controlling either the oscillator or the charge pump circuit based on the sensed bias voltage level.

The output terminal of the sensing circuit is electrically connected to a first input terminal of an inhibition gate such as a NOR gate or a NAND gate. A second input terminal of the inhibition gate is electrically connected with the output terminal of the oscillator. The output terminal of the inhibition gate is electrically connected to the charge pump or the oscillator so as to inhibit a clock signal from being input to the charge pump circuit or stop the operation of the oscillator.

The oscillator is however operated even if the clock signal is inhibited from being input to the charge pump circuit. Therefore, the current used up by the oscillator increases. When the oscillator is restarted after having been inactivated, an initial condition set to the oscillator provides unstable oscillations. There was thus a possibility of a substrate voltage remaining inconstant.

SUMMARY OF THE INVENTION

It is an object of the present invention to provide a feedback controlled substrate bias generator which can provide less current consumption.

It is another object of the present invention to provide a feedback controlled substrate bias generator which can provide a stable substrate voltage.

A feedback control led substrate bias generator according to the present invention has a substrate bias level sensing circuit, a charge pump circuit and an improved oscillator. The substrate bias level sensing circuit is coupled to a semiconductor substrate for sensing a bias voltage of the semicnductor substrate and outputting a control signal in response to the sensed bias voltage. The charge pump circuit is coupled to the semiconductor substrate and the substrate bias level sensing circuit for receiving a clock pulse and the control signal and supplying the bias voltage to the semiconductor substrate in response to the received signals. The improved oscillator is coupled to the charge pump circuit for generating the clock pulse. The improved oscillator has a loop circuit having a plurality of serially and circularly coupled inverters each of which has a source terminal applied to a voltage from a voltage source, an input terminal for receiving an input signal and an output terminal for outputting an output signal. The improved oscillator further has a plurality of switches each of which has a control terminal, a first terminal coupled to the source terminal of a corresponding inverter of the loop circuit and a second terminal coupled to the voltage source. Each of the switches electrically cuts the first and second terminals when the input signal of the one of the inverters except for the corresponding inverter changes from one level to another.

DETAILED DESCRIPTION OF THE PREFERRED EMBODIMENTS

Figure 1:
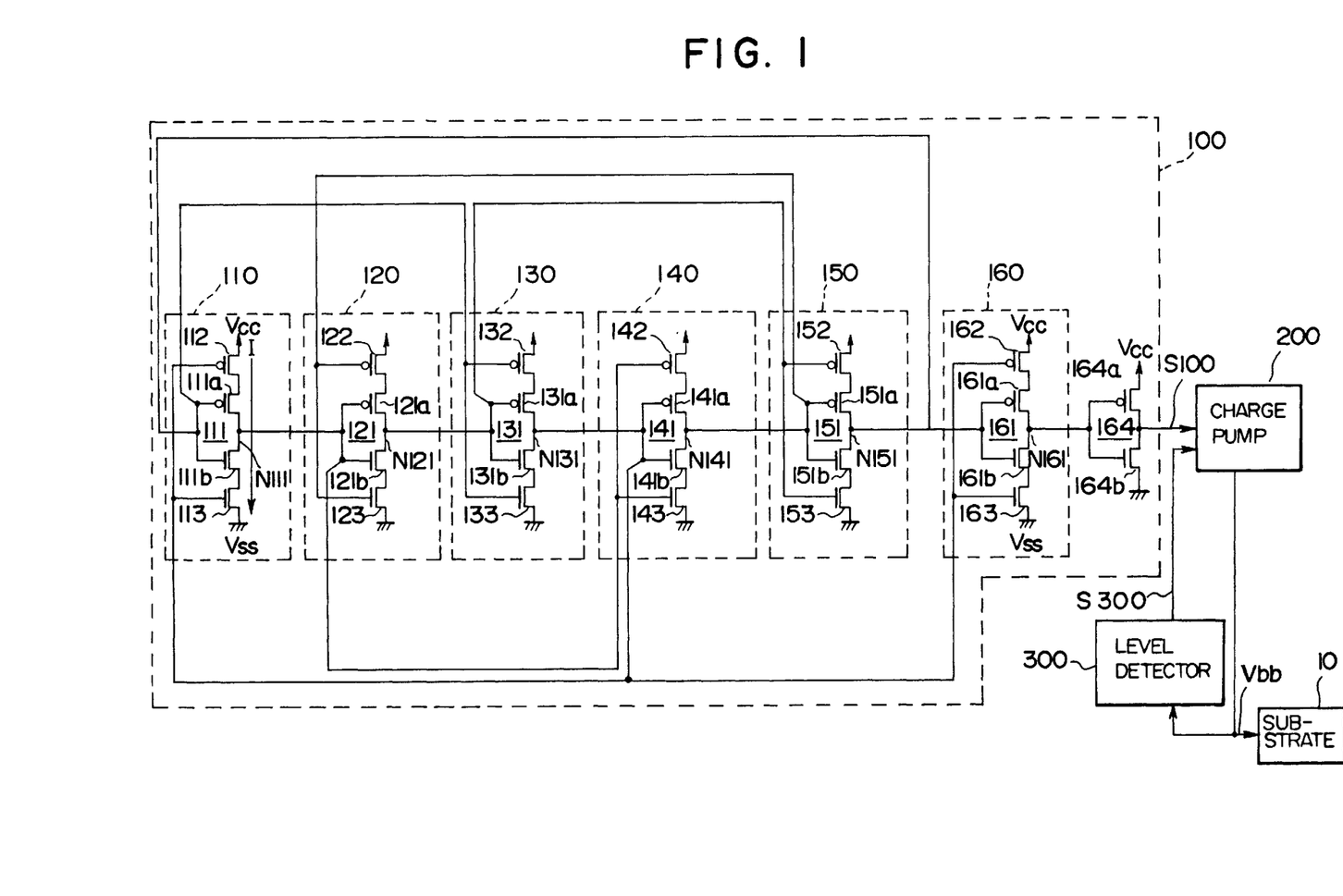
FIG. 1 is a circuit diagram showing a feedback controlled substrate bias generator according to a first embodiment of the present invention.

FIG. 1 is a circuit diagram showing a feedback controlled substrate bias generator according to a first embodiment of the present invention.

The substrate bias generator comprises an oscillator 100 operated in a ring-like arrangement (a ring oscillator), a charge pump circuit 200 electrically connected to the oscillator 100 and a semiconductor substrate 10, and a substrate bias level sensing circuit 300 electrically connected to the semiconductor substrate 10 and the charge pump circuit 200.

The oscillator 100 outputs a clock signal S100 to the charge pump circuit 200. The oscillator 100 also has five inverter circuits or stages 110, 120, 130, 140, 150 each of which are successively cascade-connected to one another through four nodes N111, N121, N131 and N141. Further, the output node N151 of the inverter circuit 150 is electrically connected with the input terminal of a waveform shaping buffer circuit, i.e., a waveform shaping buffer 160 and the input terminal of the inverter circuit 110. The output terminal of the buffer 160 is electrically connected to a CMOS inverter 164.

The inverter circuits 110, 120, 130, 140, 150 respectively include CMOS inverters 111, 121, 131, 141, 151 comprised of PMOS transistors 111*a*, 121*a*, 131*a*, 141*a*, 151*a* and NMOS transistors 111*b*, 121*b*, 131*b*, 141*b*, 151*b*, for inverting signals output from the prestage or anterior inverter circuits and supplying the inverted signals to the poststage or posterior inverter circuits, respectively. PMOS transistors (first switching means) 112, 122, 132, 142, 152 are respectively connected between the sources of the PMOS transistors 111a, 121a, 131a, 141a, 151a and a power source voltage $V_{CC}$ (first power source voltage). NMOS transistors (second switching means) 113, 123, 133, 143, 153 are respectively connected between the sources of the NMOS transistors 111b, 121b, 131b, 141b, 151b and the ground (second power source voltage) $V_{SS}$. The gates of the PMOS transistors 112, 122, 132, 142, 152 and the gates of the NMOS transistors 113, 123, 133, 143, 153 in the respective inverter circuits 110, 120, 130, 140, 150 are electrically connected to their corresponding terminals of the CMOS inverters of the inverter circuits turned two stages backwardly of the present inverter circuit or present stage.

The buffer 160 and the CMOS inverter 164, which is electrically connected to the buffer 160 and comprised of a PMOS transistor 164a and an NMOS transistor 164b, have a waveform shaping function for causing a waveform of a signal which appears at the output node N151 of the final inverter circuit 150 to abruptly rise and fall. The buffer 160 comprises a CMOS inverter 161 comprised of a PMOS transistor 161a and an NMOS transistor 161b, for inverting the signal which appears at the output node N151 of the final inverter circuit 150 and outputting the inverted signal to the CMOS inverter 164 through an output node N161, a PMOS transistor (first switching means) 162 electrically connected between the source of the PMOS transistor 161a and the power source voltage $V_{CC}$, and an NMOS transistor (second switching means) 163 electrically connected between the source of the NMOS transistor 161b and the ground $V_{SS}$. The gates of the PMOS transistor 162 and the NMOS transistor 163 are electrically connected to the input terminal of the CMOS inverter 141 of the inverter circuit 140 which is located two stages backwardly of the present stage. Stated another way, the gates of the PMOS transistor 162 and NMOS transistor 163 are electrically connected to the output node of an inverter circuit located 2K stages before the last inverter circuit 150, where K is an integer.

Figure 2:
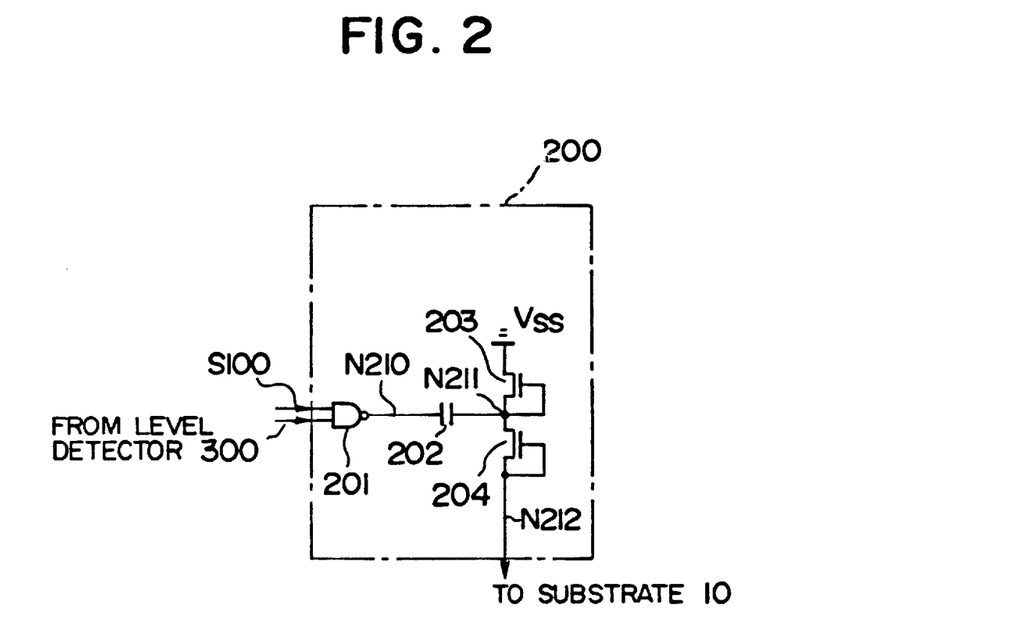
FIG. 2 is a circuit diagram illustrating a charge pump circuit shown in FIG. 1.

FIG. 2 is a circuit diagram showing the charge pump circuit shown in FIG. 1. The charge pump circuit 200 includes a NAND gate circuit 201 which has two input terminals. One of the input terminals is connected to the oscillator 100 and receives the clock pulse S100. The other input terminal is connected to the substrate bias level sensing circuit 300. The output terminal of the NAND gate circuit 201 is connected to a first terminal of a capacitor 202 through a node N210. The charge pump circuit 200 further includes a series connection of NMOS transistors 203 and 204 between the ground $V_{SS}$ and node N212 through a node N211. The drain of the NMOS transistor 203 is connected to the ground $V_{SS}$. The source and gate of the NMOS transistor 203, the drain of the NMOS transistor 204 and a second terminal of the capacitor 202 are connected to the node N211. The source and gate of the NMOS transistor 204 are connected to the node 212 which is connected to the semiconductor substrate 10.

Figure 3:
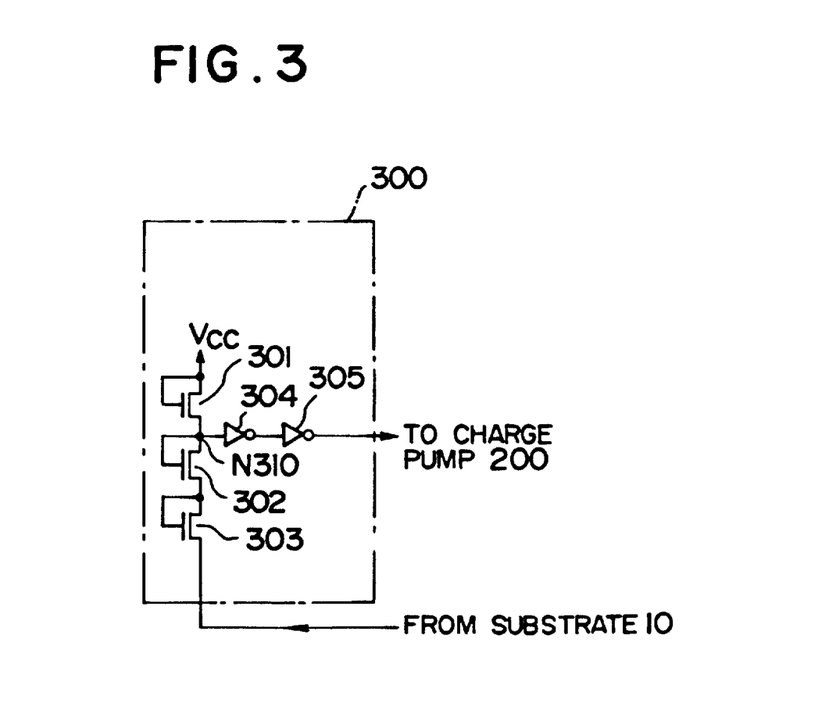
FIG. 3 is a circuit diagram depicting a substrate bias level sensing circuit shown in FIG. 1.

FIG. 3 is a circuit diagram showing the substrate bias level sensing circuit shown in FIG. 1. The substrate bias level sensing circuit 300 has a series connection of NMOS transistors 301, 302 and 303 between the power source voltage $V_{CC}$ and the semiconductor substrate 10. The drain and gate of the NMOS transistor 301 are connected to the power source voltage $V_{CC}$. The source of the NMOS transistor 301 and the gate and drain of the NMOS transistor 302 are connected to a node N310. The source of the NMOS transistor 302 and the drain and gate of the NMOS transistor 303 are connected together. The source of the NMOS transistor 303 is connected to the semiconductor substrate 10. Inverters 304 and 305 are connected in series to the node N310. The output terminal of the inverter 305 is connected to the charge pump circuit 200.

The operation of the substrate bias generator according to the present embodiment will now be described below. Incidentally, the operations of the charge pump circuit 200 and the level detector 300 have been disclosed in a co-pending application Ser. No. 519,572, filed May 7, 1990 (now Pat. No. 5,113,088 issued May 12, 1992) assigned to the same assignee as the present application, whose subject matter is incorporated herein by reference. Their detailed description will therefore be omitted.

Figure 4:
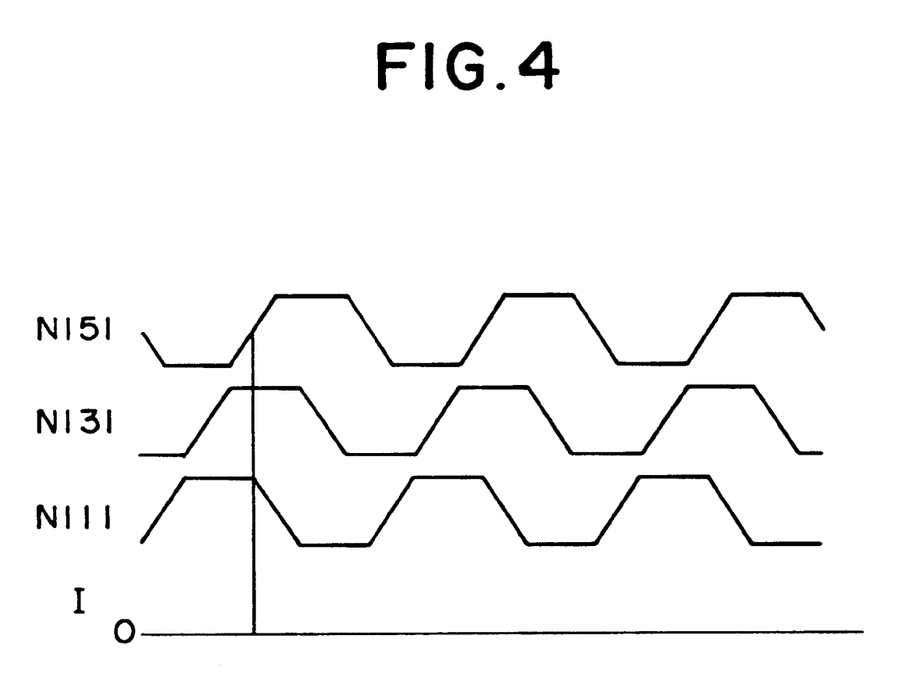
FIG. 4 is a waveform chart for describing the operation of an oscillator shown in FIG. 1.

FIG. 4 is a waveform chart for describing the operation of the oscillator 100 shown in FIG. 1. The operation of the substrate bias generator will be described below with reference to FIGS. 1 and 4.

In the oscillator 100, the inverter circuits 110, 120, 130, 140 and 150 respectively invert signals output from the inverter circuits 150, 110, 120, 130 and 140 of the previous stages and feed back the same to the corresponding inverter circuits 120, 130, 140, 150 and 110 of the subsequent stages. As a result, a pulse signal having a predetermined period is supplied to the buffer 160 from the output node N151 of the inverter circuit 150 serving as the final stage. Then, the buffer 160 inverts the signal supplied from the node N151. Further, the buffer 160 outputs the inverted signal to the CMOS inverter 164 from the node N161 thereof. The CMOS inverter 164 inverts a signal supplied from the node N161 to produce a pulse signal S100 having a given period. The pulse signal S100 thus produced is output to the charge pump circuit 200. Thus, the buffer 160 and the CMOS inverter 164 converts the signal at the node N151 whose waveform gently rises and falls into the pulse signal S100 whose waveform abruptly rises and falls.

When a substrate bias voltage $V_{bb}$ supplied to the substrate 10 from the charge pump circuit 200 is higher than a predetermined voltage, the substrate bias level sensing circuit 300 brings a control signal S300 to an "H" level. When, on the other hand, the substrate bias voltage $V_{bb}$ is lower than the predetermined voltage, the substrate bias level sensing circuit 300 renders the control signal S300 "L" in level. When the control signal S300 is "H" in level, the charge pump circuit 200 starts a charge pump operation. When the control signal S300 is "L" in level, the charge pump circuit 200 stops the charge pump operation. As a result, the substrate bias voltage $V_{bb}$ of the substrate 10 is controlled so as to be kept at a voltage not greater than the predetermined voltage at all times.

The operation of each of the inverter circuits 110, 120, 130, 140 and 150 will now be described below. Incidentally, the inverter circuits 110, 120, 130, 140 and 150 are identical in operation to each other. Therefore, the inverter circuit 110 will be described below as a typical example.

A signal input to the CMOS inverter 111 of the inverter circuit 110 and a signal input to each of the gates of the PMOS transistor 112 and the NMOS transistor 113 represent signals output from the inverter circuits 150 and 130 respectively. Therefore, the signal input to the CMOS inverter 111 and the signal input to each of the gates of both the PMOS transistor 112 and the NMOS transistor 113 differ in phase from each other.

At a time t shown in FIG. 4, an intermediate voltage which appears at the output node N151 of the inverter circuit 150, is input to the input terminal of the CMOS inverter 111 of the inverter circuit 110. Therefore, the PMOS transistor 111a and the NMOS transistor 111b are both turned on. On the other hand, an "H" level signal which appears at the output node N131 of the inverter circuit 130, is input to the gates of both the PMOS transistor 112 and the NMOS transistor 113. Therefore, the PMOS transistor 112 is brought to an off state and the NMOS transistor 113 is brought to an on state. Since the PMOS transistor 112 is brought to the off state, through current I can be prevented from flowing from the power source voltage $V_{CC}$ to the ground $V_{SS}$.

Other inverter circuits 120, 130, 140 and 150 can be handled in the same manner as the inverter circuit 110. That is, at least any one of the transistors of each of other inverter circuits 120, 130, 140 and 150, which are series-connected between the power source voltage $V_{CC}$ and the ground $V_{SS}$, is turned off. Therefore, the through current I does not flow from the power source voltage $V_{CC}$ to the ground $V_{SS}$.

Further, the wave-form shaping buffer 160 employed in the substrate bias generator according to the present embodiment also includes the PMOS transistor 162 and the NMOS transistor 163 both connected in series with the CMOS inverter 161 as the switching means. It is therefore possible to reliably prevent the through current I from flowing from the power source voltage $V_{CC}$ to the ground $V_{SS}$. Control signals of the PMOS and NMOS transistors 112 and 113, 122 and 123, 132 and 133, 142 and 143, 152 and 153, and 162 and 163 respective pairs of which serve as the switching means and are employed in their corresponding inverter circuits 110, 120, 130, 140, 150 and buffer circuit 160, represent signals output from the inverter circuits 110, 120, 130, 140, 150 respectively. It is therefore unnecessary to provide additional control means for generating such control signals.

Figure 5:
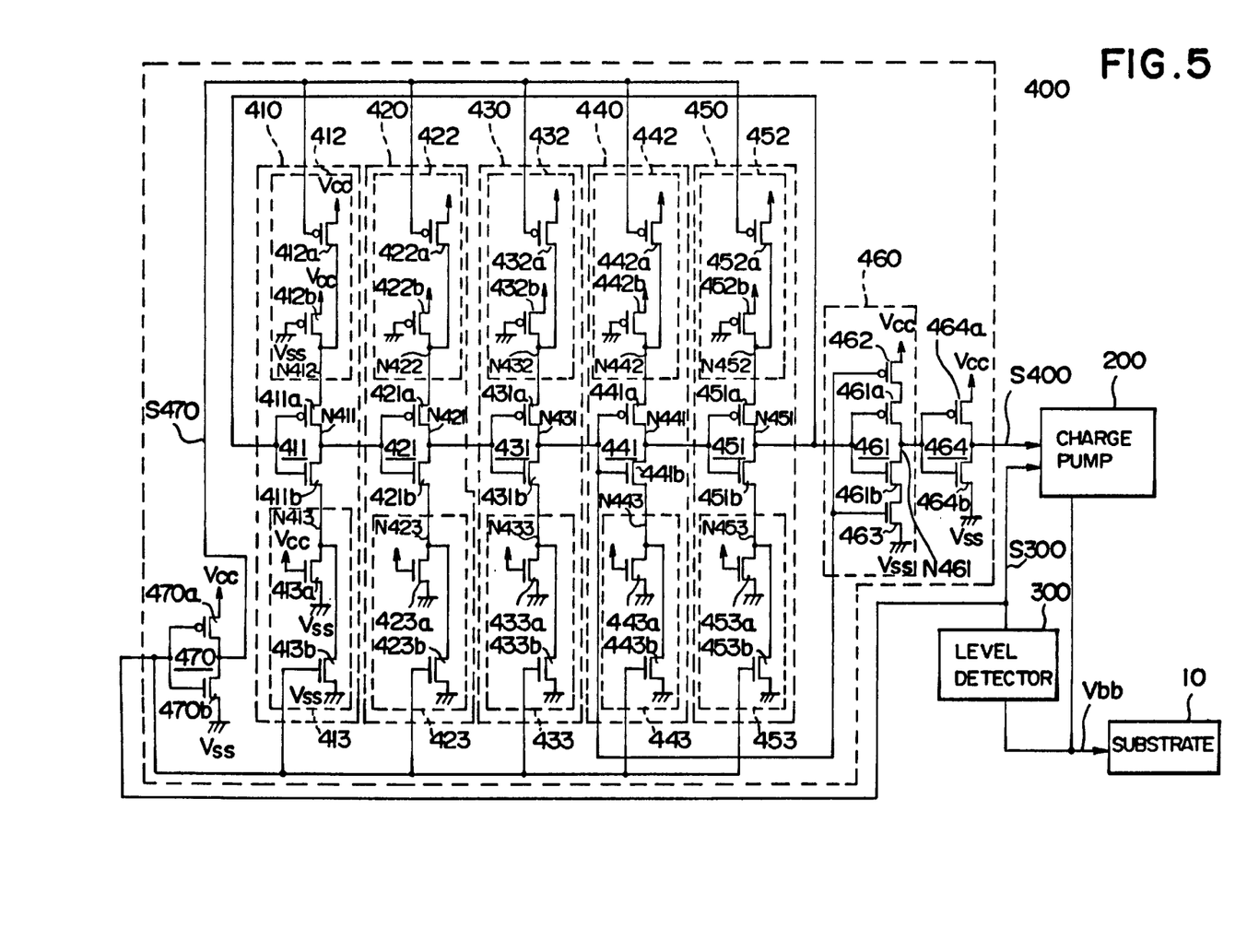
FIG. 5 is a circuit diagram showing a feedback controlled substrate bias generator according to a second embodiment of the present invention.

FIG. 5 is a circuit diagram showing a feedback controlled substrate bias generator according to a second embodiment of the present invention. The same element of structure as those employed in the substrate bias generator shown in FIG. 1 are identified by the same reference numerals.

The substrate bias generator according to the second embodiment has an oscillator 400 operated in a ring-like arrangement, which differs from the oscillator 100 shown in FIG. 1. A charge pump circuit 200 similar to that shown in FIG. 1 is electrically connected to the output terminal of the oscillator 400. Further, a substrate bias level sensing circuit 300 is electrically connected to the charge pump circuit 200.

The oscillator 400 supplies a frequency-variable pulse signal S400 to the charge pump circuit 200. The oscillator 400 also has five inverter circuits 410, 420, 430, 440, 450. The output nodes N411, N421, N431, N441, N451 of the inverter circuits 410, 420, 430, 440, 450 are cascade-connected to one another. The output node N451 of the inverter circuit 450 is electrically connected to a waveform shaping buffer 460 and a CMOS inverter 464. Further, the oscillator 400 includes a CMOS inverter 470 comprised of a PMOS transistor 470a and an NMOS transistor 470b, for inverting a control signal S300 output from the substrate bias level sensing circuit 300 and outputting a control signal S470 therefrom.

The inverter circuits 410, 420, 430, 440, 450 respectively include CMOS inverters 411, 421, 431, 441, 451 which invert signals output from the prestage inverter circuits respectively and supply the inverted signals to the poststage inverter circuits which are comprised of PMOS transistors 411a, 421a, 431a, 441a, 451a and NMOS transistors 411b, 421b, 431b, 441b, 451b respectively. The inverter circuits 410, 420, 430, 440, 450 respectively include PMOS transistors 412, 422, 432, 442, 452 (first switching means) connected between their corresponding high-voltage input nodes N412, N422, N432, N442, N452 of the CMOS inverters 411, 421, 431, 441, 451 and a power source voltage $V_{CC}$, and NMOS transistors 413, 423, 433, 443, 453 (second switching means) connected between their corresponding low-voltage input nodes N413, N423, N433, N443, N453 and the ground $V_{SS}$. The PMOS transistors 412, 422, 432, 442, 452 serving as the first switching means respectively include PMOS transistors 412a, 422a, 432a, 442a, 452a on/off-controlled in accordance with the a control signal S470, and PMOS transistors 412b, 422b, 432b, 442b, 452b which are controlled so as to be normally turned on. The PMOS transistors 412a, 422a, 432a, 442a, 452a are respectively parallel-connected between the high-voltage input nodes N412, N422, N432, N442, N452 of the CMOS inverters 411, 421, 431, 441, 451 and the power source voltage $V_{CC}$. Similarly, the PMOS transistors 412b, 422b, 432b, 442b, 452b are respectively parallel-connected between the high-voltage input nodes N412, N422, N432, N442, N452 and the power source voltage $V_{CC}$. The NMOS transistors 413, 423, 433, 443, 453 serving as the second switching means respectively include NMOS transistors 413a, 423a, 433a, 443a, 453a controlled so as to be normally turned on, and NMOS transistors 413a, 423a, 433a, 443a, 453b on/off-controlled in accordance with the control signal S300. The NMOS transistors 413a, 423a, 433a, 443a, 453a are respectively parallel-connected between the low-voltage input nodes N413, N423, N433, N443, N453 and the ground $V_{SS}$, whereas the NMOS transistors 413b, 423b, 433b, 443b, 453b are respectively parallel-connected between the low-voltage input nodes N413, N423, N433, N443, N453 and the ground $V_{SS}$.

The buffer 460 and the CMOS inverter 464 have a waveform shaping function for shaping rising and falling waveforms of a signal which appears at the output node N451 of the inverter circuit 450 corresponding to the final stage into abrupt waveforms. The buffer 460 comprises a CMOS inverter 461 comprised of a PMOS transistor 461a and an NMOS transistor 461b, for inverting the signal which appears at the output node N451 and outputting the inverted signal from a node N461, a PMOS transistor (first switching means) 462 electrically connected between the source of the PMOS transistor 461a and the power source voltage $V_{CC}$, and an NMOS transistor (second switching means) 463 electrically connected between the source of the NMOS transistor 461b and the ground $V_{SS}$. The gates of the PMOS transistor 462 and the NMOS transistor 463 are electrically connected to the output node N431 of the inverter circuit 430. The CMOS inverter 464 connected to the output node N461 of the buffer 460 inverts the signal output from the node N461 and supplies the inverted signal, i.e., a pulse signal S400 to the charge pump circuit 200. The CMOS inverter 464 includes a PMOS transistor 464a electrically connected to the power source voltage $V_{CC}$ and an NMOS transistor 464b electrically connected to the ground GND, i.e., $V_{SS}$.

The operation of the substrate bias generator according to the second embodiment will next be described below with reference to FIGS. 6 and 7.

Figure 6:
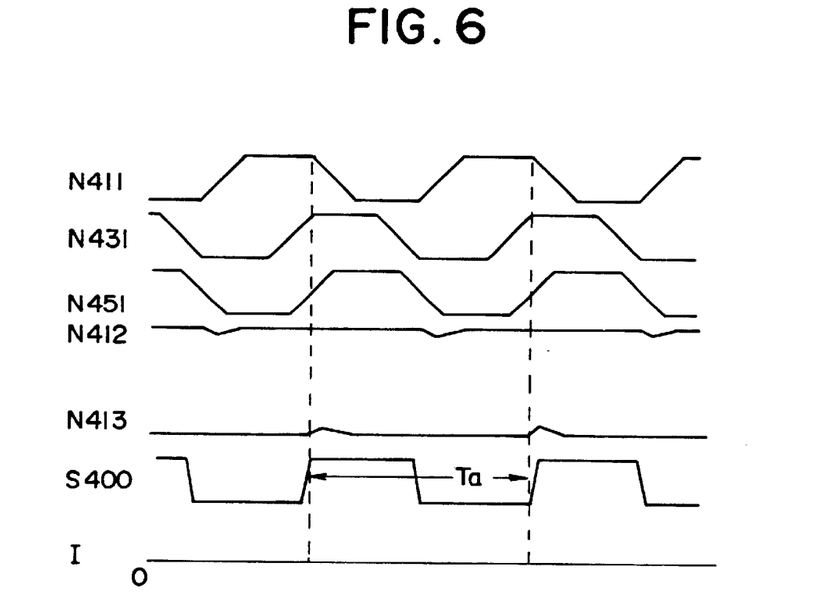
FIG. 6 is a waveform chart for describing the operation of an oscillator shown in FIG. 5.

FIG. 6 is a view for describing each of the waveforms of signals which appear at the nodes in the oscillator 400 where the charge pump circuit 200 is in operation because the substrate bias voltage $V_{bb}$ is less than a predetermined level, the control signals S300, S470 are "H" and "L" in level respectively and the PMOS transistor 412a and the NMOS transistor 413b of the inverter circuit 410 are both in an on state. FIG. 7 is a view for describing each of waveforms of signals which appear at the nodes in the oscillator 400 where the charge pump circuit 200 is in nonoperation because the substrate bias voltage $V_{bb}$ is maintained at the predetermined level, the control signals S300, S470 are "L" and "H" in level respectively and the PMOS transistor 412a and the NMOS transistor 413b of the inverter circuit 410 are both in an off state. Incidentally, each of Ta, Tb (Ta<Tb) shown in FIGS. 6 and 7 represent a period of the pulse signal S400.

When the substrate bias voltage $V_{bb}$ does not reach the predetermined level as shown in FIG. 6, the charge pump circuit 200 is operated so as to bring the control signal S300 output from the substrate bias level sensing circuit 300 to an "H" level. The control signal S300 is inverted by the inverter 470 to thereby produce the control signal S470 which is brought to an "L" level. Therefore, the PMOS transistors 412a, 422a, 432a, 442a, 452a respectively included in the PMOS transistors 412, 422, 432, 442, 452, serving as the first switching means, of the inverter circuits 410, 420, 430, 440, 450 are turned on, so that the equivalent resistances of the first switching means 412, 422, 432, 442, 452 are reduced. Further, the NMOS transistors 413b, 423b, 433b, 443b, 453b included in the NMOS transistors 413, 423, 433, 443, 453, serving as the second switching means, are brought to the on state, so that the equivalent resistances of the second switching means 413, 423, 433, 443, 453 are also reduced. Since the equivalent resistances of the first switching means 412, 422, 432, 442, 452 and those of the second switching means 413, 423, 433, 443, 453 are reduced as described above, the period Ta of the pulse signal S400 supplied from the oscillator 400 to the charge pump circuit 200 is made shorter. The charge pump circuit 200 supplies a voltage not greater than a voltage of a predetermined level to the substrate 10 so that the substrate bias voltage $V_{bb}$ is rapidly brought to a voltage which does not exceed the predetermined voltage.

Figure 7:
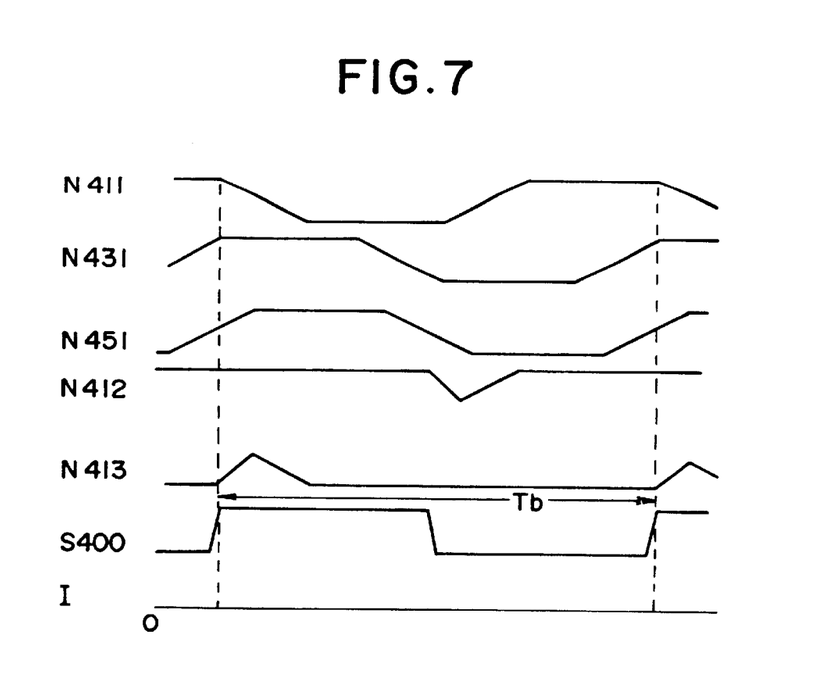
FIG. 7 is another waveform chart for describing the operation of the oscillator shown in FIG. 5.

When the substrate bias voltage $V_{bb}$ is brought to predetermined level voltage as shown in FIG. 7 the control signal S300 output from the substrate bias level sensing circuit 300 is rendered "L" in level so that the charge pump circuit 200 is inactivated. At this time, the control signal S300 which is "L" in level, is inverted by the CMOS inverter 470 so as to produce a control signal S470 which is "H" in level. Therefore, the PMOS transistors 412a, 422a, 432a, 442a, 452a of the first switching means 412, 422, 432, 442, 452 in the inverter circuits 410, 420, 430, 440, 450, and the NMOS transistors 413b, 423b, 433b, 443b, 453b of the second switching means 413, 423, 433, 443, 453 in the inverter circuits 410, 420, 430, 440, 450 are all turned off, so that only the normally on-controlled PMOS transistors 412b, 422b, 432b, 442b, 452b and NMOS transistors 413a, 423a, 433a, 443a, 453a are turned on. As a result, the equivalent resistances of the first switching means 412, 422, 432, 442, 452 and those of the second switching means 413, 423, 433, 443, 453 increase as compared with the case where the substrate bias voltage $V_{bb}$ shown in FIG. 6 does not reach the predetermined level voltage. Accordingly, a period Tb of the pulse signal S400 output from the oscillator 400 becomes longer than the period Ta. An oscillating cycle or period within a time interval which makes it unnecessary to produce the output of the oscillator 400 can therefore be increased, thereby making it possible to reduce the power consumption.

The buffer 460 has the CMOS inverter 461, which is electrically connected with the PMOS transistor 462 and the NMOS transistor 463. Therefore, any one of the transistors series-connected between the power source voltage $V_{CC}$ and the ground $V_{SS}$ can be brought to the off state, thereby making it possible to effectively prevent the through current from flowing.

Incidentally, the present invention is not necessarily limited to the present embodiment and various modifications can be made. The following modifications can be shown by way of illustrative example.

(a) The first embodiment shown in FIG. 1 and the second embodiment shown in FIG. 5 can bring about advantageous effects independently of each other. However, a further great effect can also be obtained by combining the first and second embodiments together.

For example, the first switching means 412, 422, 432, 442, 452 shown in FIG. 5 are electrically connected in series with the PMOS transistors 112, 122, 132, 142, 152 of the inverter circuits 110, 120, 130, 140, 150 shown in FIG. 1, respectively. Further, the second switching means 413, 423, 433, 443, 453 shown in FIG. 5 are electrically connected in series with the NMOS transistors 113, 123, 133, 143, 153, respectively. With this arrangement, the advantageous effects of the first and second embodiments can be brought about, and the substrate bias generator whose dissipated power is very low and has a superb characteristic can be produced.

(b) The oscillators 100, 400 shown in FIGS. 1 and 5 respectively comprise the five inverter circuits 110, 120, 130, 140, 150 and the five inverter circuits 410, 420, 430, 440, 450. However, the number of the inverter circuits may be arbitrarily set. In this case, the gates of the PMOS transistors 112, 122, 132, 142, 152 and those of the NMOS transistors 113, 123, 133, 143, 153 in the inverter circuits 110, 120, 130, 140, 150 shown in FIG. 1 may be on-off controlled in accordance with the output signals of the inverter circuits turned 2K (where K=is a natural number) stages backwardly of the present stage.

Having now fully described the invention, it will be apparent to those skilled in the art that many changes and modifications can be made without departing from the spirit or scope of the invention as set forth herein.

What is claimed is:

1. A feedback controlled substrate bias generator comprising:

a substrate bias level sensing circuit coupled to a semiconductor substrate for sensing a bias voltage of the semiconductor substrate and outputting a control signal in response to the sensed bias voltage;

a charge pump circuit coupled to the semiconductor substrate and said substrate bias level sensing circuit for receiving the control signal and supplying the bias voltage to the semiconductor substrate in response to the received control signal; and an oscillator coupled to said charge pump circuit for generating a clock pulse, the oscillator including
a loop circuit having a plurality of serially and circularly coupled inverters each of which has a source terminal for receiving a voltage from a voltage source, an input terminal for receiving an input signal and an output terminal for outputting an output signal; and
a plurality of switches each of which has a first terminal coupled to the source terminal of a corresponding inverter of the loop circuit and a second terminal coupled to the voltage source, each of the switches electrically isolating the first terminal from the second terminal thereof to prevent current flow between said first and second terminals when the output signal of an inverter other than the corresponding inverter changes from one level to another.

2. A feedback controlled substrate bias generator according to claim 1, wherein each of said plurality of switches has a control terminal, said control terminal being coupled to the input terminal of an inverter other than the corresponding inverter.

3. A feedback controlled substrate bias generator according to claim 1, wherein the switch is a MOS transistor.

4. A feedback controlled substrate bias generator according to claim 1, wherein said oscillator further comprises a buffer circuit having first and second source terminals for receiving first and second applied voltages, an input terminal coupled to the output terminal of one of the inverters and an output terminal coupled to the charge pump circuit for supplying the clock pulse.

5. A feedback controlled substrate bias generator according to claim 1, wherein each of the inverters has a first source terminal applied to a first voltage from a first voltage source and a second source terminal applied to a second voltage from a second voltage source.

6. A feedback controlled substrate bias generator according to claim 5, wherein each of the inverters has a first PMOS transistor having a source coupled to the first source terminal thereof, a drain coupled to the output terminal thereof and a gate coupled to the input terminal thereof, and a first NMOS transistor having a source coupled to the second source terminal thereof, a drain coupled to the output terminal thereof and a gate coupled to the input terminal thereof.

7. A feedback controlled substrate bias generator according to claim 5, wherein each of the switches has a second PMOS transistor having a source coupled to the first voltage source, a drain coupled to the first source terminal and a gate coupled to the control terminal thereof, and a second NMOS transistor having a source coupled to the second voltage source, a drain coupled to the second source terminal and a gate coupled to the gate of the second PMOS transistor.

8. A feedback controlled substrate bias generator according to claim 4, wherein the buffer circuit has an inverter including a third PMOS transistor having a source coupled to the first source terminal thereof, a drain coupled to the output terminal thereof and a gate coupled to the input terminal thereof, and a third NMOS transistor having a source coupled to the second source terminal thereof, a drain coupled to the output terminal thereof and a gate coupled to the input terminal thereof.

9. A ring oscillator for use in a charge pump comprising N inverter stages each having a primary input, a secondary input, and an output, wherein N is an odd integer, the output of each inverter stage is coupled to the primary input of a following inverter stage in a serially-connected ring fashion such that the output of a last inverter stage is coupled to the primary input of a first inverter stage and forms an oscillator signal output, and the secondary input of each stage is coupled to the output of an Mth preceding inverter stage, wherein M is an odd integer greater or equal to three.

10. A ring oscillator as in claim 9 in which M is equal to three.

11. A ring oscillator as in claim 9 in which each inverter stage comprises:

means for inverting the logic signal at the output if both the primary and secondary inputs are switched from a first logic state to a second logic state; and means for inhibiting zero crossing current if the primary and secondary inputs are at different logic states.

12. A ring oscillator as in claim 9 in which each inverter stage comprises:

a first P-channel transistor having a gate, a drain, and a source;

a first N-channel transistor having a gate, a drain, and a source, the gates of the first P-channel and N-channel transistors being coupled together to form the primary input, and the drains of the first P-channel and N-channel transistors being coupled together to form the output;

a second P-channel transistor having a gate, a drain coupled to, the source of the first P-channel transistor, and a source coupled to a first source of supply voltage;

a second N-channel transistor having a gate, a drain coupled to the source of the first N-channel transistor; and a source coupled to a second source of supply voltage, the gates of the second P-channel and N-channel transistors being coupled together to form the secondary input.

13. A method of generating an oscillating signal that minimizes power consumption due to zero-crossing current, the method comprising the steps of:

providing a ring oscillator for use in a charge pump including N inverter stages each having a primary input, a secondary input, and an output, wherein N is an odd integer;

coupling the output of each inverter stage to the primary input of a following inverter stage in a serially-connected ring fashion;

coupling the output of a last inverter stage to the primary input of a first inverter stage to form an output for generating the oscillating signal; and coupling the secondary input of each stage to the output of an Mth preceding inverter stage, wherein M is an odd integer greater or equal to three.

14. The method of claim 13 further comprising the step of setting M equal to three.

15. A ring oscillator circuit for outputting an oscillating signal, comprising:

a ring oscillator having N inverter stages each of which has an input terminal and an output terminal, the output terminal of each inverter stage being coupled to the input terminal of a following inverter stage in a serially-connected ring fashion such that the output terminal of a last inverter stage is coupled to the input terminal of a first inverter stage, wherein N is an odd integer, each of the inverter stages of said ring oscillator including:

an inverter circuit having a source terminal for receiving a voltage from the voltage source, an input terminal coupled to the output terminal of the preceding inverter stage, and an output terminal; and a switch circuit having a first terminal coupled to the source terminal of the inverter circuit, a second terminal coupled to the voltage source and a control terminal coupled to the input terminal of the inverter stage preceding the present inverter stage by 2K inverter stages; and a buffer circuit, said buffer circuit including,
  an inverter circuit having a source terminal for receiving a voltage from a voltage source, an input terminal coupled to the output terminal of the last inverter stage, and an output terminal for outputting the oscillating signal, and
  a switch circuit having a first terminal coupled to the source terminal of the inverter circuit, a second terminal coupled to the voltage source, and a control terminal coupled to the output terminal of the inverter stage preceding the last inverter stage by 2K inverter stages, where K is an integer.

16. A ring oscillator circuit according to claim 15, wherein the inverter circuit of the inverter stage comprises:
  a first MOS transistor of a first conductive type having a gate coupled to the output terminal of the preceding inverter stage, a drain coupled to the output terminal of the inverter circuit, and a source; and
  a second MOS transistor of a second conductive type having a gate coupled to the output terminal of the preceding inverter stage, a drain coupled to the output terminal of the inverter circuit, and a source.

17. A ring oscillator circuit according to claim 16, wherein the switch circuit of the inverter stage comprises:
  a third MOS transistor of the first conductive type having a gate coupled to the output terminal of the inverter stage preceding the inverter stage immediately preceding the present inverter stage by 2K inverter stages, a drain coupled to the source of the first transistor and a source coupled to receive a first voltage from the voltage source; and
  a fourth MOS transistor of the second conductive type having a gate coupled to the output terminal of the inverter stage preceding the inverter stage immediately preceding the present inverter stage by 2K inverter stages, a drain coupled to the source of the second transistor and a source coupled to receive a second voltage from the voltage source.

* * * * *